(12) United States Patent
Chen et al.

(10) Patent No.: US 8,124,884 B2
(45) Date of Patent: Feb. 28, 2012

(54) PRINTED CIRCUIT BOARD

(75) Inventors: Yung-Chieh Chen, Taipei Hsien (TW);
Cheng-Hsien Lee, Taipei Hsien (TW);
Shou-Kuo Hsu, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 245 days.

(21) Appl. No.: 12/693,418

(22) Filed: Jan. 25, 2010

(65) Prior Publication Data

US 2011/0168437 A1   Jul. 14, 2011

(30) Foreign Application Priority Data

Jan. 14, 2010   (CN) .......................... 2010 1 0300313

(51) Int. Cl.
*H05K 1/11* (2006.01)

(52) U.S. Cl. ...................... 174/261; 174/260; 361/321.1; 439/65; 439/108; 439/404; 439/607.1; 327/161; 257/416; 257/737; 257/773; 375/232; 375/257; 375/326; 375/327; 375/350

(58) Field of Classification Search .................. 174/261, 174/260, 262; 361/321.1; 439/65, 108, 404, 439/607.1; 327/161; 257/416, 737, 773; 375/232, 257, 326, 327, 350

See application file for complete search history.

*Primary Examiner* — Xiaoliang Chen
(74) *Attorney, Agent, or Firm* — Altis Law Group, Inc.

(57) ABSTRACT

A printed circuit board (PCB) includes a positive differential signal line including first and second segments, a negative differential signal line including third and fourth segments, first and second connecting elements soldered on opposite surfaces of the PCB. The first segment and the fourth segment are located in a first straight line which has a first permittivity. The third segment and the second segment are located in a second straight line which has a second permittivity different from the first permittivity. The first connecting element is connected between the first segment and the second segment. The second connecting element is connected between the third segment and the fourth segment.

3 Claims, 4 Drawing Sheets

PRINTED CIRCUIT BOARD

BACKGROUND

1. Technical Field

The present disclosure relates to printed circuit boards (PCBs) and, particularly, to a PCB which can reduce fiber-weave effect.

2. Description of Related Art

Typical PCBs are constructed from various woven fiberglass fabrics, strengthened and bound together with epoxy resin. The fiberglass and epoxy resin may have different levels of permittivity respectively, presenting a non-homogeneous medium for signal transmission. The non-homogeneous medium in the PCBs may influence signal transmission, called fiber-weave effect. An ordinary method for reducing fiber-weave effect is a zig-zag routing mode in the PCBs.

Referring to FIG. 1, an ordinary PCB 10 is designed in a Zig-zag routing mode. The PCB 10 includes two differential signal pairs 13 and 17. The differential signal pair 13 includes a positive differential signal line 12 and a negative differential signal line 14. The differential signal pair 17 includes a positive differential signal line 16 and a negative differential signal line 18. The differential signal lines 12, 14, 16, and 18 are designed in zig-zag shape which can reduce fiber-weave effect. However, the PCB designed in zig-zag routing mode may increase layout space and complexity, and is time-consuming.

DETAILED DESCRIPTION

Figure 1:
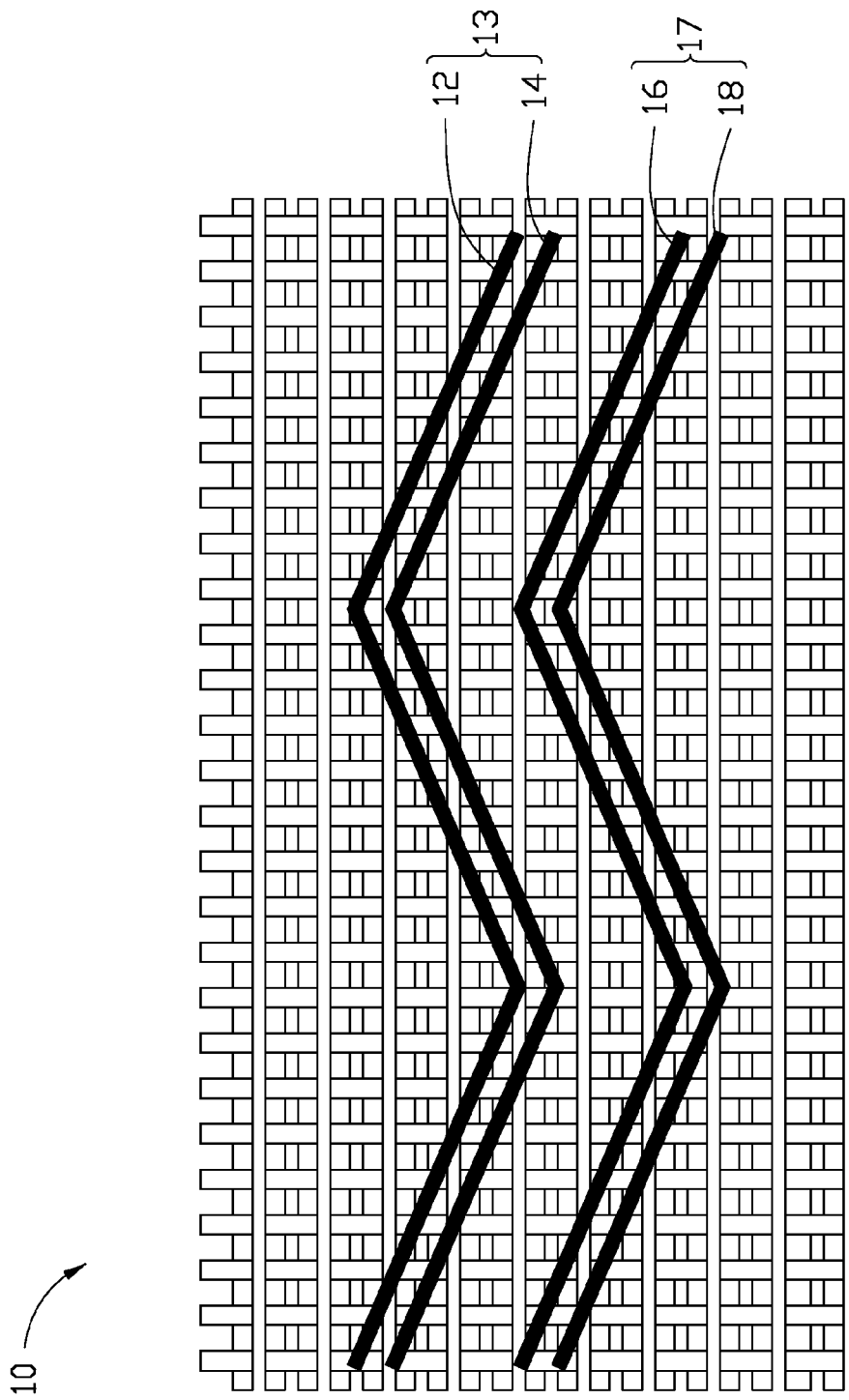
FIG. 1 is a horizontally cross-sectional, schematic view of an ordinary printed circuit board (PCB).
Figure 2:
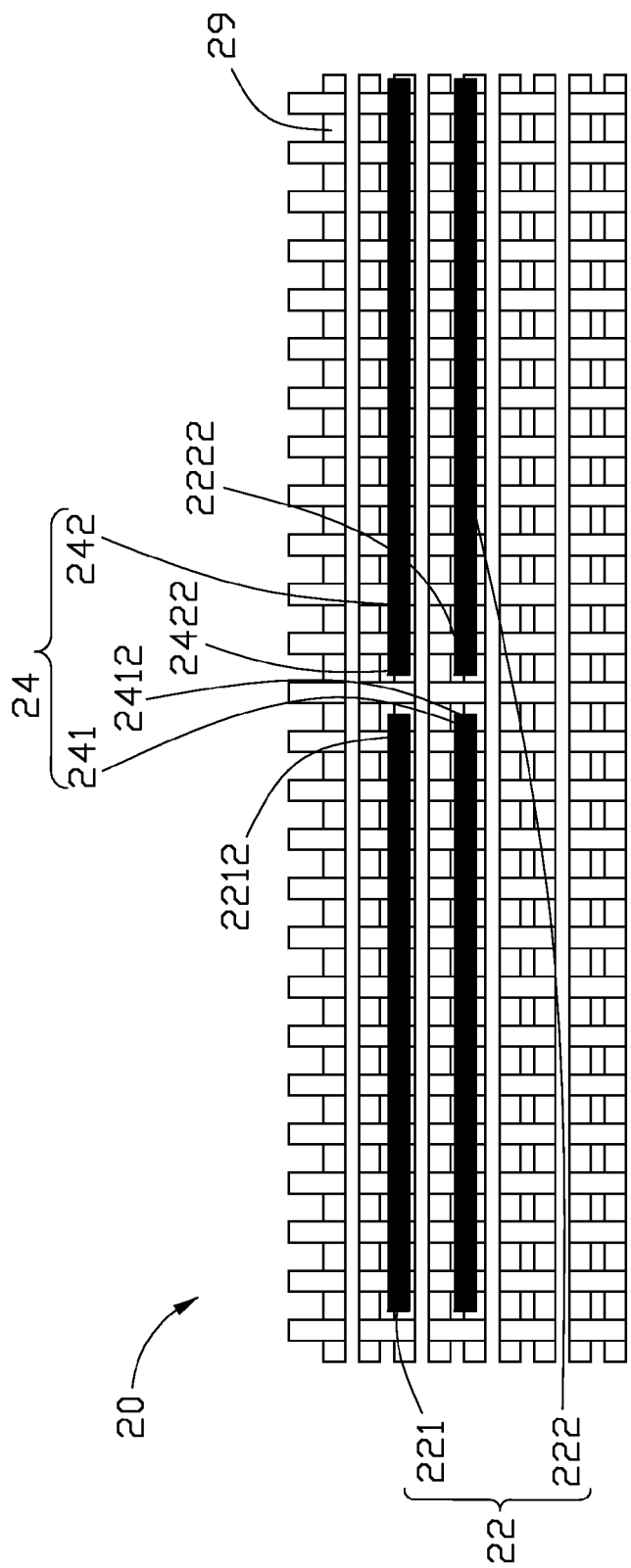
FIG. 2 is a horizontally cross-sectional, schematic view of an exemplary embodiment of a PCB.
Figure 3:
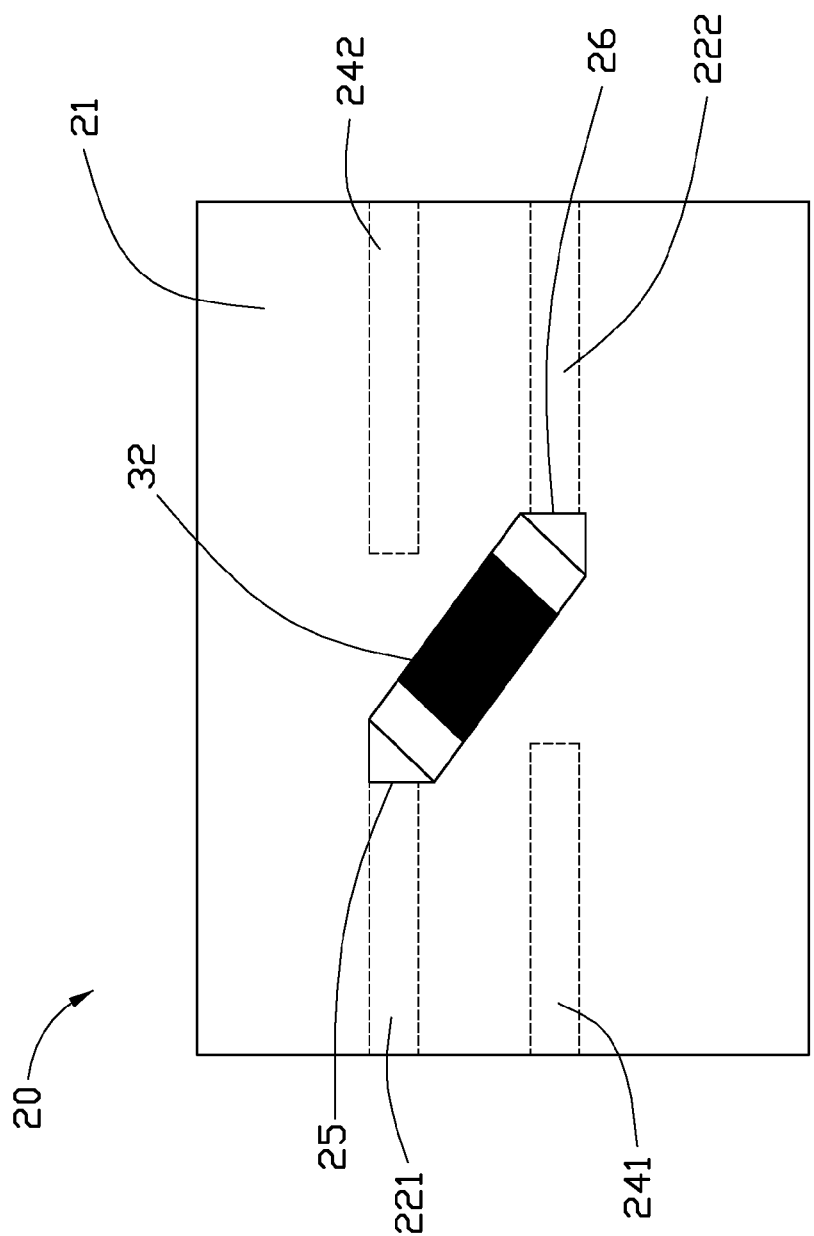
FIG. 3 is a schematic plan view of a top surface of the PCB of FIG. 2.
Figure 4:
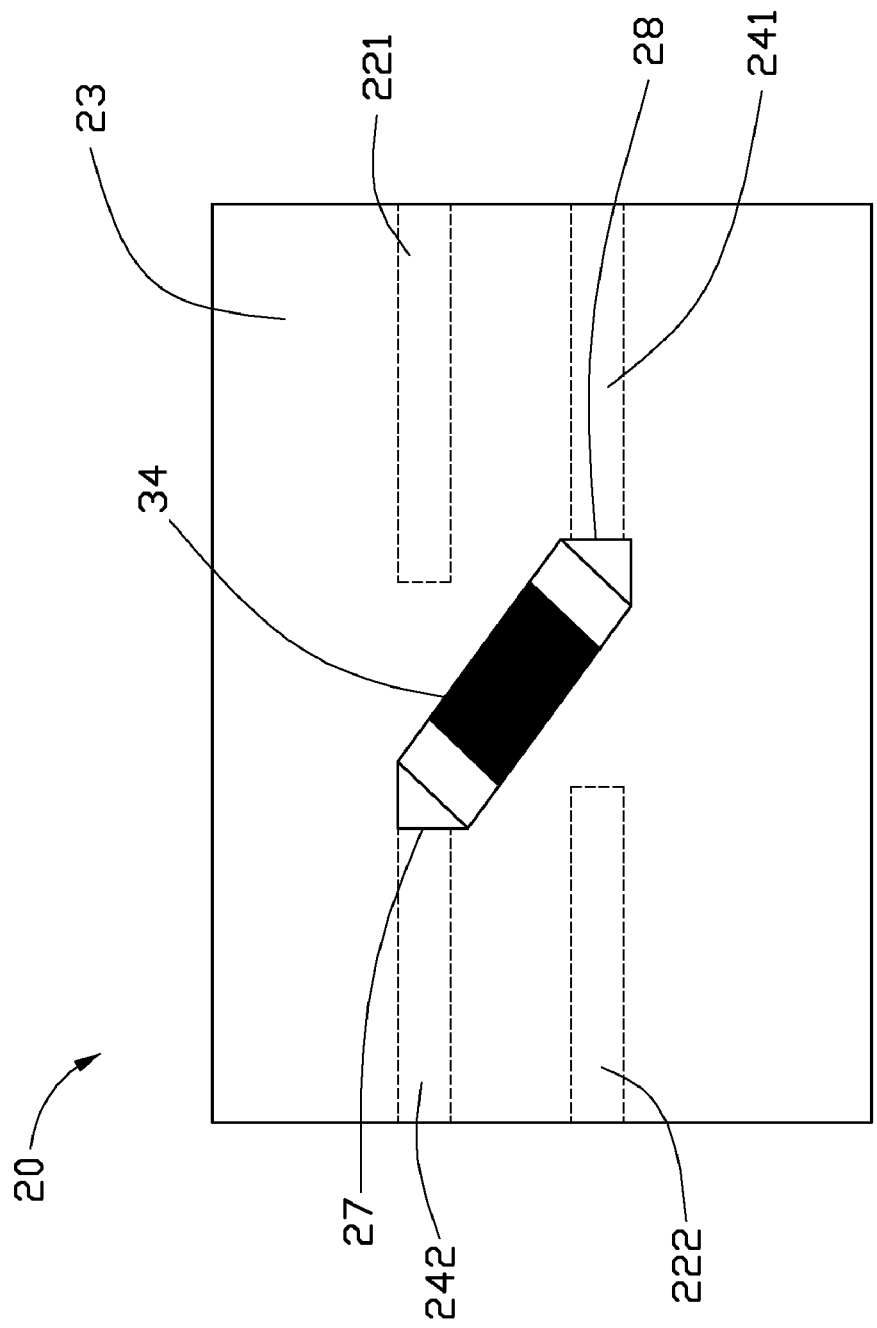
FIG. 4 is a schematic plan view of a bottom surface of the PCB of FIG. 2.

Referring to FIGS. 2 to 4, an exemplary embodiment of a printed circuit board (PCB) 20 includes a positive differential signal line 22, a negative differential signal line 24, a first connecting element 32, and a second connecting element 34. The first connecting element 32 and the second connecting element 34 have coupling function between two differential signal lines. In one embodiment, the first connecting element 32 and the second connecting element 34 are alternating current coupling capacitors.

Two pads 25 and 26 are arranged on a top surface 21 of the PCB 20. Two terminals of the first connecting element 32 are soldered on the two pads 25 and 26, respectively. Two pads 27 and 28 are arranged on a bottom surface 23 of the PCB 20. Two terminals of the second connecting element 34 are soldered on the two pads 27 and 28, respectively.

The positive differential signal line 22 includes a first segment 221 and a second segment 222 arranged apart from each other in a signal layer 29 of the PCB 20. The negative differential signal line 24 includes a third segment 241 and a fourth segment 242 arranged apart from each other in the signal layer 29 of the PCB 20. In one embodiment, lengths of the first segment 221, the second segment 222, the third segment 241, and the fourth segment 242 are the same.

The first segment 221 and the fourth segment 242 are located in a first straight line which has a first permittivity. The third segment 241 and the second segment 222 are located in a second straight line which has a second permittivity and is parallel to the first straight line. The first permittivity is different from the second permittivity. The first segment 221 is juxtaposed in parallel with the third segment 241. The second segment 222 is juxtaposed in parallel with the fourth segment 242. An end 2212 of the first segment 221, which is adjacent to the fourth segment 242, is electrically connected to the pad 25 through a via (not shown). An end 2222 of the second segment 222, which is adjacent to the third segment 241, is electrically connected to the pad 26 through a via (not shown). An end 2412 of the third segment 241, which is adjacent to the second segment 222, is electrically connected to the pad 28 through a via (not shown). An end 2422 of the fourth segment 242, which is adjacent to the first segment 221, is electrically connected to the pad 27 through a via (not shown).

Because the first connecting element 32 is soldered on the pads 25 and 26, and the second connecting element 34 is soldered on the pads 27 and 28, the first segment 221 and the second segment 222 of the positive differential signal line 22 are electrically connected to each other via the first connecting element 32, and the third segment 241 and the fourth segment 242 of the negative differential signal line 24 are electrically connected to each other via the second connecting element 34.

Because the positive and negative differential signal lines 22 and 24 are arranged in the signal layer 29 in a straight line, the positive and negative differential signal lines 22 and 24 do not occupy excessive space of the PCB 20, and it is very easy to layout the positive and negative differential signal lines 22 and 24.

Furthermore, because the first to fourth segments 221, 222, 241, and 242 are symmetrically arranged in the signal layer 29, the fiber-weave effect between the differential signal lines 22 and 24 is counteracted, which can improve signal transmitting quality effectively.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB), comprising:
    a first surface;
    a second surface opposite to the first surface;
    a signal layer located between the first and second surfaces;
    a positive differential signal line and a negative differential signal both arranged on the signal layer, wherein the positive differential signal line comprises a first segment and a second segment, the negative differential signal line comprises a third segment and a fourth segment, the first segment and the fourth segment are located in a first straight line which has a first permittivity, the third segment and the second segment are located in a second straight line which has a second permittivity and is parallel to the first straight line, the first permittivity is different from the second permittivity; the first segment is juxtaposed in parallel with the third segment, and the second segment is juxtaposed in parallel with the fourth segment; and a first connecting element soldered on the first surface and a second connecting element soldered on the second surface;

wherein an end of the first segment adjacent to the fourth segment is electrically connected to a first terminal of the first connecting element, an end of the second segment adjacent to the third segment is electrically connected to a second terminal of the first connecting element; wherein an end of the third segment adjacent to the second segment is electrically connected to a first terminal of the second connecting element, an end of the fourth segment adjacent to the first segment is electrically connected to a second terminal of the second connecting element.

2. The PCB of claim 1, wherein lengths of the first segment, the second segment, the third segment, and the fourth segment are the same.

3. The PCB of claim 1, wherein the first connecting element and the second connecting element are alternating current coupling capacitors.

* * * * *